United States Patent
Schrems et al.

(10) Patent No.: US 6,376,348 B1
(45) Date of Patent: *Apr. 23, 2002

(54) RELIABLE POLYCIDE GATE STACK WITH REDUCED SHEET RESISTANCE AND THICKNESS

(75) Inventors: Martin Schrems, Langebrueck (DE); Matthias Ilg, Richmond, VA (US)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,235

(22) Filed: Sep. 30, 1997

(51) Int. Cl.[7] .......................................... H01L 21/3205
(52) U.S. Cl. .................. 438/592; 438/594; 438/491; 438/244; 438/542
(58) Field of Search .................. 438/592, 593, 438/594, 244, 387, 491, 495, 542

(56) References Cited

U.S. PATENT DOCUMENTS

| | | | |
|---|---|---|---|
| 4,992,391 A | * | 2/1991 | Wang .......................... 438/593 |
| 5,512,502 A | * | 4/1996 | Ootsuka et al. .............. 438/592 |
| 5,543,350 A | * | 8/1996 | Chi et al. ..................... 438/238 |
| 5,712,196 A | * | 1/1998 | Ibok ............................ 438/592 |
| 5,723,377 A | * | 3/1998 | Torii ........................... 438/303 |
| 5,767,558 A | * | 6/1998 | Lo et al. ...................... 257/412 |
| 5,773,358 A | * | 6/1998 | Wu et al. .................... 438/564 |
| 5,792,686 A | * | 8/1998 | Chen et al. .................. 438/244 |
| 5,801,424 A | * | 9/1998 | Luich .......................... 257/377 |
| 5,814,863 A | * | 9/1998 | Pan ............................. 257/346 |
| 5,828,130 A | * | 10/1998 | Miller et al. ................. 257/754 |
| 5,834,356 A | * | 11/1998 | Bothra et al. ............... 438/384 |

OTHER PUBLICATIONS

Wolf Standlye, Silicon Processing for the VLSI Era, vol. 1, p. 178, 1986.*

* cited by examiner

Primary Examiner—Chandra Chaudhari
Assistant Examiner—Thanh Nguyen

(57) ABSTRACT

Formation of a gate having a polysilicon and silicide layer thereover with reduced resistance and reduced thickness is provided. The polysilicon layer is annealed to diffuse the dopants out from the surface to reduce the dopant concentration to below the level which causes metal rich interface. Thus, a metal silicide layer can be deposited without an intrinsic poly cap layer or requiring the poly to having a decreased dopant concentration. As such, a thinner gate stack having lower sheet resistance and improved reliability is achieved.

16 Claims, 2 Drawing Sheets

RELIABLE POLYCIDE GATE STACK WITH REDUCED SHEET RESISTANCE AND THICKNESS

The field of the present invention relates generally to semiconductor fabrication and, more particularly, to transistors with polysilicon-silicide gates.

BACKGROUND OF THE INVENTION

In device fabrication, insulating, semiconducting, and conducting layers are formed on a substrate. The layers are patterned to create features and spaces. The features and spaces are patterned so as to form devices, such as transistors, capacitors, and resistors. These devices are then interconnected to achieve a desired electrical function, creating an integrated circuit (IC).

To reduce sheet resistance, a metal oxide semiconductor (MOS) transistor employs a polycide gate. The polycide gate comprises metal silicide, such as tungsten silicide ($WSi_x$) over heavily doped polysilicon (poly). Typically, the poly is doped with phosphorus (P). The poly should contain as high a dopant concentration as possible to lower its sheet resistance.

However, metal silicide over heavily doped poly shows stoichiometric control problems, which are expressed in the form of a metallic-rich interface. A metallic-rich interface is undesirable since it is not resistant to subsequent thermal processes. As a result, the interface gets oxidized. Oxidation causes surface roughness and, in some cases, delamination of the silicide film. As such, the interface between the poly and silicide should be maintained below a level which produces a metallic-rich interface. Typically, the P concentration should be kept below $10^{19}$ atoms/cm$^3$.

Conventionally, the adverse effects of metallic rich interface are avoided by providing an intrinsic (undoped) layer of poly between the heavily doped poly and the metal silicide. Another technique that avoids a metal-rich interface is to lower the dopant concentration of the poly. However, such techniques undesirably increase gate resistance, resulting in decreased device performance.

From the above description, it is desirable to provide a reliable polycide gate with reduced sheet resistance.

SUMMARY OF THE INVENTION

The invention relates to formation of a reliable gate conductor with decreased thickness and lower sheet resistance. In one embodiment, the decreased thickness and lower sheet resistance are achieved by forming a heavily doped poly layer and annealing it to diffuse dopants out from the surface thereof to decrease the dopant concentration to below that which causes metal rich interface. This allows a metal silicide layer to be deposited without an intrinsic cap poly layer or requiring the poly to having a lower dopant concentration.

DETAILED DESCRIPTION OF THE INVENTION

The present invention relates to a reliable polycide gate with reduced sheet resistance. To facilitate discussion of the invention, it is described in the context of a memory IC. However, the invention is significantly broader and is applicable to ICs in general. A description of a DRAM cell is provided.

Figure 1:
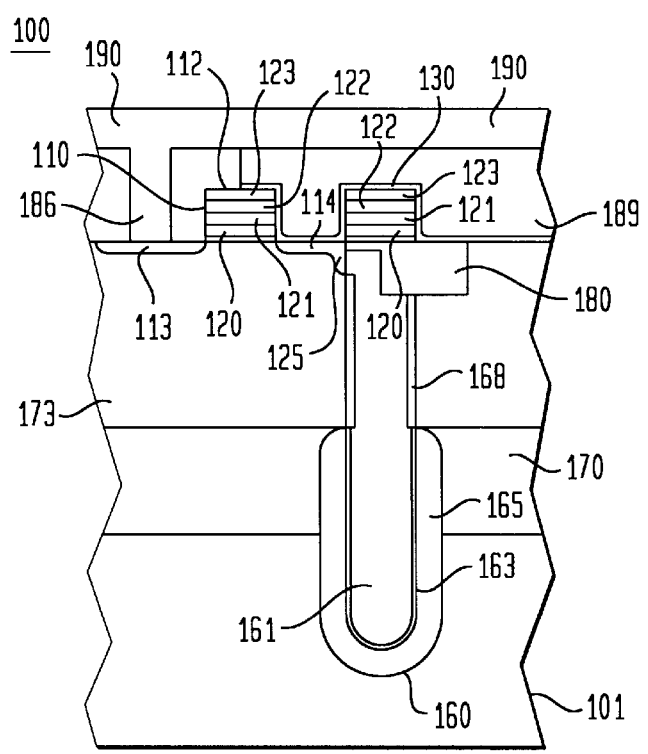
FIG. 1 illustrates an illustrative DRAM cell.

Referring to FIG. 1, a trench capacitor type DRAM cell 100 is shown. Such trench capacitor DRAM cell is described in, for example, Nesbit et al., *A 0.6 µm$^2$ 256 Mb Trench DRAM Cell With Self-Aligned Buried Strap (BEST)*, IEDM 93-627, which is herein incorporated by reference for all purposes. Although a trench capacitor DRAM cell is shown, the invention is not limited to such. For example, a stack capacitor DRAM cell can also be used. Typically, an array of such cells is interconnected by wordlines and bitlines to form a DRAM IC.

Illustratively, the DRAM cell 100 comprises a trench capacitor 160 formed in a substrate 101. The trench is filled with, typically, polysilicon (poly) 161 that is heavily doped with dopants having a first conductivity such as n-type. The poly serves as one plate of the capacitor, referred to as a "storage node." A buried plate 165 doped with dopants of the first conductivity surrounds the lower portion of the trench. In the upper portion of the trench is a collar 168 to reduce parasitic leakage. A node dielectric 163 separates the two plates of the capacitor. A buried well 170 comprising dopants of the first conductivity is provided to connect the buried plates of the DRAM cells in the array. Above the buried well is a well 173 comprising dopants having a second conductivity, such as p-type. The p-well comprises a dopant concentration sufficient to form an opposite conductivity junction to reduce vertical leakage of a transistor 110.

The transistor includes a polycide gate stack 112. The gate stack, which is sometimes referred to as a "gate conductor" (GC), serves as a wordline in the DRAM array. As shown, the gate stack includes a poly layer 120 that is heavily doped with dopants. In one embodiment, the poly layer 120 is heavily doped with P dopants. The use of boron (B) or arsenic (As) dopants is also useful. To keep the sheet resistance low, the dopant concentration of the poly should be as high as possible. Above the heavily doped poly 120 are provided an intrinsic poly layer 121 and a metal silicide layer 122. The intrinsic poly layer serves as a buffer layer to avoid a metal rich interface between the silicide and heavily doped poly layers. Although dopants from the heavily doped poly layer diffuse into the intrinsic poly during the subsequent thermal processes, the poly is intrinsic during initial deposition of the metal silicide layer. Above the metal silicide layer is a nitride layer that serves as an etch stop layer.

Heavily doped diffusion regions 113 and 114 are provided adjacent the gate. The diffusion regions comprise dopants having the same conductivity as the poly layer and opposite that of well 173. The diffusion region, for example, is heavily doped with n-type dopants. Depending on the direction of current flow, the diffusion regions 113 and 114 are either referred to as the "drain" or "source", respectively. As used herein, the terms "drain" and "source" are interchangeable. Connection between the transistor and the capacitor is achieved via a diffusion region 125, referred to as the "node diffusion."

A shallow trench isolation (STI) 180 is provided to isolate the DRAM cell from other cells or devices. As shown, a wordline 130, is formed over the trench and isolated therefrom by the STI. Wordline 130 is referred to as the "passing wordline" since it is not electrically coupled to the DRAM cell shown but is coupled to an other DRAM cell which is not shown. Such configuration is referred to as a folded bitline architecture. Other configurations including open and open-folded are also useful.

An interlevel dielectric layer 189 is formed over the wordlines. A conductive layer, representing a bitline 190, is formed over the interlevel dielectric layer. A bitline contact opening 186 is provided in the interlevel dielectric layer to contact the source 113 to the bitline 190.

As previously discussed, the use of the intrinsic poly buffer layer between the heavily doped poly and silicide layer increases the thickness of the gate stack. This increased thickness is undesirable because it produces higher aspect ratio features which dreate difficulties in filling.

Figure 2A:
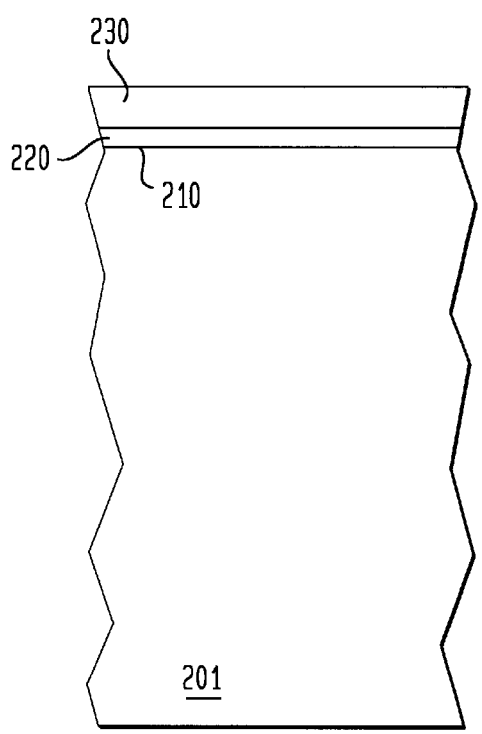
FIGS. 2a–2c illustrated the formation of a polycide gate conductor in accordance with the invention.
Figure 2B:
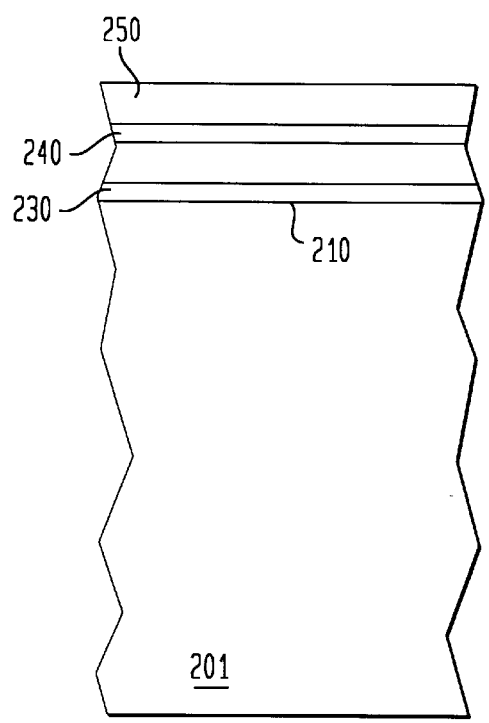
Figure 2C:
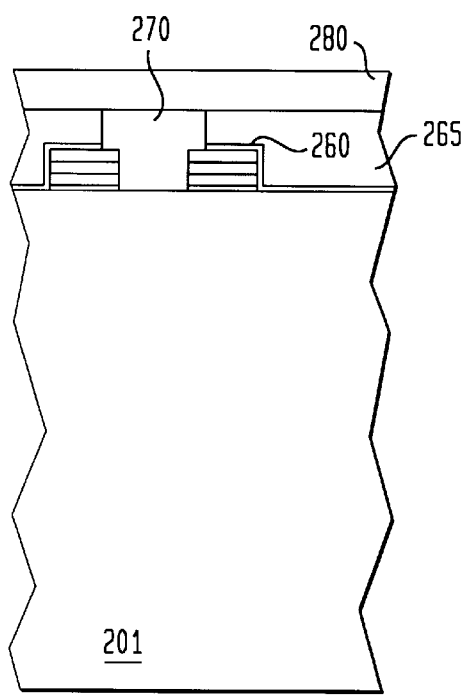

FIGS. 2a–c show the process of forming a polycide gate stack in accordance with the invention. Referring to FIG. 2a, a cross section of a substrate representing a portion of an IC is shown. Such an IC, for example, is a memory IC including a random access memory (RAM), a dynamic RAM (DRAM), a synchronous DRAM (SDRAM), a static RAM (SRAM), and a read only memory (ROMs). Also, the IC may be a logic devices such as a programmable logic array (PLA), an application specific IC (ASIC), a merged DRAM-logic IC (embedded DRAM) or any other logic device.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

The substrate 201 is, for example, a silicon wafer. Other substrates such as silicon on insulator (SOI), silicon on sapphire (SOS), germanium, gallium arsenide, and group III–V compounds, are also useful. In one embodiment, the substrate is lightly doped with dopants having a first conductivity. In one embodiment, the substrate is lightly doped with p-type dopants (p$^-$), such as B. The concentration of B is about $1.5 \times 10^{16}$ atoms/cm$^3$.

The substrate, for example, includes a plurality of trench capacitors (not shown) formed therein. The trench capacitors, for example, are those described in FIG. 1. In one embodiment, the trench capacitors serve as storage capacitors for n-channel DRAM cells. Buried n-wells are provided to connect the n-type buried plates of the capacitors together. P-wells are provided for the n-channel DRAM access transistors. The concentrations of the p-wells is about $5 \times 10^{17}$–$8 \times 10^{17}$ cm$^{-3}$. Additionally, n-type wells are provided for p-channel transistors, such as those employed in support circuitry. Other diffusion regions may be provided in the substrate as necessary.

At this point of processing, the substrate includes a planar surface 210. A sacrificial oxide layer (not shown) is formed over the surface. The sacrificial oxide layer serves as a screen oxide for implanting ions to adjust the gate threshold voltage ($V_t$) of the subsequently formed transistors. The $V_t$ adjust implant employs, for example, conventional lithographic and masking techniques to selectively implant the dopants in the channel region of the gate. Such techniques include depositing a photoresist layer over the screen oxide layer and selectively exposing it with an exposure source and mask. Depending on whether a positive or negative resist is used, either the exposed or unexposed portions of the resist layer are removed during development to selectively expose regions of the substrate below. The exposed regions are then implanted with ions to achieve the desired $V_t$.

After the $V_t$ implant, the resist and screen oxide layers are removed by, for example, a wet etch. A thin oxide layer 220 is then formed on the substrate surface. The oxide layer serves as the gate oxide. In one embodiment, the gate oxide is grown by thermal oxidation. The thickness of the gate oxide is, for example, about 6–10 nm.

A poly layer 230 is then deposited over the gate oxide layer 220. The poly layer is heavily doped with dopants to reduce sheet resistance. In one embodiment, the poly layer is doped with phosphorus (P). N-type dopants such as Arsenic (As) or p-type dopants such as boron (B) are also useful. The dopant concentration of P is about $2 \times 10^{20}$–$5 \times 10^{20}$ atoms/cm$^3$, preferably about $5 \times 10^{20}$ atoms/cm$^3$.

The doped poly layer is deposited by, for example, chemical vapor deposition (CVD). The dopants are incorporated into the layer during the CVD process. Such process is referred to as in-situ doped CVD. In one embodiment, the P doped poly layer is deposited by in-situ doping rapid thermal CVD (RTCVD). In an illustrative embodiment, the layer is deposited in a CVD reactor at a temperature of about 620–680° C. and a pressure of about 100 Torr. Alternatively, the poly could be deposited in amorphous form. For example, amorphous deposition of poly could be performed at a temperature of as low as 570° C. SiH$_4$ and PH$_3$ are injected, along with carrier gases, into the reactor. SiH$_4$ serves as a silicon precursor and PH$_3$ serves as a P dopant source, respectively. Also low pressure CVD (LPCVD) is useful in depositing the poly.

The substrate is then annealed to outdiffuse dopants for the P doped poly layer 230. The anneal is sufficient to reduce the concentration of dopants at the surface of the doped poly layer. The dopant concentration is reduced to below that which produces a metal-rich interface. In one embodiment, the P concentration is reduced to below about $10^{19}$ atoms/cm$^3$ to avoid a metal-rich interface with a subsequently deposited metal silicide layer. The anneal is performed at a temperature greater than the deposition temperature. In one embodiment, the temperature of the anneal is between about 700–1000° C. The pressure of the anneal is below that of the deposition pressure. The pressure, in one embodiment, is between about 0.02–10 Torr. Where the poly is deposited by LPCVD, the anneal pressure would be lower in order to be below the deposition pressure.

The outdiffusion step enables the doped poly layer to have a sufficiently high dopant concentration at the bulk while reducing the dopant concentration at the surface. This avoids surface roughness caused by metal-rich interface due to interaction with a subsequently deposited metal silicide layer without requiring a buffer poly layer. As a result, a reliable polycide gate conductor with lower sheet resistance can be formed.

Referring to FIG. 2b, a metal silicide layer 240 is deposited over the poly layer 230. In one embodiment, the metal silicide comprises tungsten silicide (WSi$_x$). Other metal silicides, such as molybdenum silicide (MoSi$_x$), tantalum silicide (TaSi$_x$), titanium silicide (TiSi$_x$), cobalt silicide (CoSi$_x$), or any other metal silicide, are also useful. The WSiX is deposited by, for example, known CVD techniques. Such techniques include injecting, for example, tungsten hexafluoride (WF$_6$), silane (S$_1$H$_4$), dichlorsilane (SiCl$_2$H$_2$), and carrier gas into a reaction chamber to produce the WSi layer. Above the metal silicide layer is formed a cap layer 250. The cap layer comprises, for example, nitride. The cap nitride layer may serve as a polish and/or etch stop for subsequent processing.

Referring to FIG. 2c, the gate stack layers are patterned to form gate conductors 260. Patterning of the gate conductors is achieved using conventional lithographic and etch techniques. Such techniques include depositing a resist layer and selectively exposing the resist layer with an exposure source and mask. Portions of the resist are removed after development to leave portions of the gate stacks unprotected. The unprotected portions of the gate stack are removed by, for example, a reactive ion etch (RIE).

Spacers (not shown) can be optionally formed on the sidewalls of the gate conductors. After spacer formation, dopants are implanted to form diffusion regions adjacent to the gate of the transistors. The spacers define the underlap diffusion of diffusion regions, which reduces overlap capacitance.

A nitride layer is deposited over the surface of the substrate, serving a mobile ion barrier and as an etch stop for formation of borderless bitline contacts. A dielectric layer 265 is formed over the device structure to provide insulation between the conducting layers (except where contact is desired) or to act as a protective layer to insulate the device structure from impurities, moisture, and scratches. The dielectric layer, for example, includes phosphorus-doped silicon dioxide such as phosphosilicate glass (PSG) or borophosphosilicate glass (BPSG).

Contacts 270 are formed in the dielectric layer, providing connections to the conductive layer 280. The conductive layer, for example, represents a bitline of the DRAM chip.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

What is claimed is:

1. A process for forming a reliable polycide gate conductive layer with decreased thickness and lower sheet resistance over a portion of a silicon substrate comprising:
    a) depositing over the portion of the substrate a layer of polysilicon that is doped with dopants to a concentration greater than the concentration that would produce a metal-rich interface with a superposed layer of a metal silicide;
    b) annealing the substrate at a temperature and for a time sufficient to outdiffuse dopants from the polysilicon layer to provide a top surface layer in which the dopant concentration is reduced below a concentration that would form a metal-rich interface layer with a superposed layer of a metal silicide; and
    c) depositing a metal silicide layer over said top surface of the polysilicon layer in a manner to avoid formation of a metal-rich interface between the polysilicon layer and the metal silicide layer; said annealing is performed at a temperature higher than the temperature at which the polysilicon layer is deposited, and at a pressure lower than the pressure at which the polysilicon layer is deposited.

2. The process of claim 1 in which the dopant concentration in the polysilicon layer before the outdiffusion is between about $2\times10^{20}$ atoms/cm$^3$ and $5\times10^{20}$ atoms/cm$^3$.

3. The process of claim 2 in which the dopant concentration in the top surface polysilicon layer after the outdiffusion is no greater than about $10^{19}$ atoms/cm$^3$.

4. The process of claim 1 in which the outdiffusion step is performed at a temperature higher than the temperature at which the polysilicon layer was deposited on the substrate.

5. The process of claim 4 in which the outdiffusion step is performed at lower pressure than the pressure at which the polysilicon layer is deposited on the substrate.

6. The process of claim 5 in which the polysilicon layer is deposited on the substrate by chemical vapor deposition at a temperature below 680° C. and the temperature of heating for the outdiffusion is at least 700° C.

7. The process of claim 6 in which the concentrations of the dopants in the top surface polysilicon before the outdiffusion is between about $2\times10^{20}$ and $5\times10^{20}$ atoms/cm$^2$ and after the outdiffusion is no greater than about $10^{19}$ atoms/cm$^3$.

8. The process of claim 7 in which the metal silicide deposited is selected from the group consisting of tungsten silicide, molybdenum silicide, tantalum silicide, titanium silicide and cobalt silicide.

9. A process of forming a reliable gate electrode conductive layer with decreased thickness and lower sheet resistance over a gate dielectric of an MOS transistor comprising:
    a) depositing over the gate dielectric of a silicon substrate a layer of polysilicon that is doped with dopants to a concentration greater than the concentration that would produce a metal-rich interface with a superposed layer of a metal silicide;
    b) annealing the substrate at a temperature and for a time sufficient to outdiffuse dopants from the polysilicon layer to provide a top surface layer in which the dopant concentration is below a concentration that would produce a metal-rich layer with a superposed layer of a metal silicide; and
    c) depositing a metal silicide layer over the top surface polysilicon layer in a manner to avoid formation of a metal-rich interface between the polysilicon layer and the metal silicide layer; said annealing is performed at a temperature higher than the temperature at which the polysilicon layer is deposited, and at a pressure lower than the pressure at which the polysilicon layer is deposited.

10. The process of claim 9 in which the dopant concentration in the top surface polysilicon layer before the outdiffusion is between about $2\times10^{20}$ and $5\times10^{20}$ atoms/cm$^3$.

11. The process of claim 10 in which the dopant concentration in the top surface polysilicon layer after the outdiffusion is no greater than about $10^{19}$ atoms/cm$^3$.

12. The process of claim 11 in which the outdiffusion step is performed at a temperature higher than the temperature at which the polysilicon layer was deposited on the substrate.

13. The process of claim 12 in which the outdiffusion step is performed at a lower pressure than the pressure at which the polysilicon layer is deposited on the substrate.

14. The process of claim 13 in which the polysilicon layer is deposited by chemical vapor deposition at a temperature below 680° C. and the temperature for outdiffusion is at least 700° C.

15. The process of claim 14 in which the concentrations of the dopants in the top surface polysilicon before the outdiffusion is between about $2\times10^{20}$ and $5\times10^{20}$ atoms/cm$^2$ and after the outdiffusion is no greater than about $10^{19}$ atoms/cm$^3$.

16. The process of claim 15 in which the metal silicide is selected from the group consisting of tungsten silicide, molybdenum silicide, tantalum silicide, titanium silicide and cobalt silicide.

* * * * *